(12) United States Patent
Chen et al.

(10) Patent No.: US 6,200,840 B1
(45) Date of Patent: Mar. 13, 2001

(54) METHOD FOR PRODUCING PMOS DEVICES

(75) Inventors: Coming Chen, Yang-Mai Chen; Jih-Wen Chou, Hsin-Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/344,739

(22) Filed: Jun. 25, 1999

(51) Int. Cl.[7] ................................................. H01L 21/338
(52) U.S. Cl. ........................ 438/184; 438/302; 438/303
(58) Field of Search .................................. 438/184, 230, 438/267, 303, 304, 595, 596, 639, 696, 185, 231, 302

(56) References Cited

U.S. PATENT DOCUMENTS

| | | | |
|---|---|---|---|
| 5,221,632 | * 6/1993 | Kurimoto et al. | 438/595 |
| 5,744,395 | * 4/1998 | Shue et al. | 438/592 |
| 5,904,517 | * 5/1999 | Gardner et al. | 438/197 |
| 5,989,966 | * 11/1999 | Huang | 438/305 |
| 6,022,785 | * 2/2000 | Yeh et al. | 438/305 |

* cited by examiner

Primary Examiner—David Nelms
Assistant Examiner—Dung A Le

(57) ABSTRACT

A method for preventing boron segregation and out diffusion to form PMOS devices is disclosed. The method includes a semiconductor substrate which is provided and forms a gate oxide layer as well as a gate layer on top of the semiconductor substrate. Next, a photoresist layer is formed on a top surface of the gate layer, moreover, pattern transfers onto the photoresist layer after going through an exposure and a development. Furthermore, the gate layer and the gate oxide layer are then etched by using the photoresist layer as a mask, and the photoresist layer is removed afterward. In succession, a thin nitride oxide (NO, $N_2O$) layer is grown by utilizing rapid thermal oxidation (RTO) and rapid thermal nitridation (RTN). Hereafter, high doped drain regions of boron ion shallow junctions are formed by carrying out ion implantation. A TEOS layer and a silicon nitride layer are deposited by using LPCVD, and forming spacers by etching the silicon nitride layer and the TEOS layer. Next, heavily doping of boron ions occurs as well as an annealing process. The final stage is a procedure of forming metal silicides.

24 Claims, 4 Drawing Sheets

METHOD FOR PRODUCING PMOS DEVICES

BACKGROUND OF THE INVENTION

1. Field of the Invention

The present invention generally relates to a method for producing PMOS devices, and more particularly to a method for preventing boron segregation and out diffusion for producing PMOS devices.

2. Description of the Prior Art

Continuous expansion of integrated circuit density requires chip area to remain the same or even become smaller in order to reduce circuit unit cost incessantly, and the only solution to this is an endless diminishment of the design rules. Moreover, once devices shrink in size, the degree of shrinkage in gate sizes is even greater than for other design rules, and it is mainly because of the taking of the fact of device efficiency into consideration. The junctions of source/drain regions must be shallow to avoid short channel effect when devices shrink in size. Therefore, boron ions (boron or boron fluoride) with low energy and high dosage must be used, and shallow junctions of PMOS devices are formed by carrying out ion implantation. But thermal diffusion might occur inside the silicon wafer that is caused by the implanted boron ions during a follow-up annealing process. This results in low resistivity source/drain regions and high driving current because the boron ion density closest to the wafer's surface is decreased, furthermore, semiconductor device performance is worsened.

SUMMARY OF THE INVENTION

In accordance with the present invention, a method is provided for forming PMOS devices that substantially prevents boron segregation and out diffusion.

It is an object of the present invention to provide a method to prevent boron segregation and out diffusion for producing PMOS devices, because a thin nitride oxide (NO, $N_2O$) layer is formed by using rapid thermal oxidation (RTO) and rapid thermal nitridation (RTN) in the present invention. Although a crystallized structure on the silicon wafer's surface can be recovered during a follow-up annealing process, thermal diffusion might occur inside the silicon wafer that is caused by the implanted boron ions. Hence, the boron ion density closest to the wafer's surface will be decreased. By means of the formation of this thin nitride oxide (NO, $N_2O$) layer, reduction of boron ion density close to the surfaces of source/drain regions due to boron segregation to TEOS liner oxide layer and out diffusion can be effectively prevented during the annealing process. Therefore, the boron ion density closest to the wafer's surface can be maintained.

It is another object of the present invention to provide a method producing PMOS devices which with low resistivity source/drain regions and high driving current by a thin nitride oxide (NO, $N_2O$) layer formed by using rapid thermal oxidation (RTO) and rapid thermal nitridation (RTN). Moreover, during a follow-up annealing process, thermal diffusion might occur inside the silicon wafer that is caused by the implanted boron ions. Hence, the boron ion density close to the wafer's surface will be decreased and end up with higher resistivity and lower driving current. By means of the formation of this thin nitride oxide (NO, $N_2O$) layer, the boron ion density closest to the wafer's surface can be maintained, resulting in low resistivity source/drain regions and high driving current, furthermore, semiconductor device performance is improved.

In one embodiment, a method for preventing boron segregation and out diffusion is provided. First of all, a semiconductor substrate is provided and forms a gate oxide layer as well as a gate layer on top of the semiconductor substrate. Next, a photoresist layer is formed on a top surface of the gate layer, moreover, pattern transfers onto the photoresist layer after going through an exposure and a development. Furthermore, the gate layer and the gate oxide layer are then etched by using the photoresist layer as a mask, and the photoresist layer is removed afterward. In succession, a thin nitride oxide (NO,$N_2O$) layer is grown by utilizing rapid thermal oxidation (RTO) and rapid thermal nitridation (RTN) processes.

High doped drain regions (HDDs) of boron ion shallow junctions are then formed by carrying out ion implantation. A TEOS layer and a silicon nitride layer are deposited by using low pressure chemical vapor deposition (LPCVD), and spacers are formed by etching the silicon nitride layer and the TEOS layer. Next, a heavy doping of boron ions occurs as well as an annealing process. The final stage would be a procedure of forming metal silicides.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
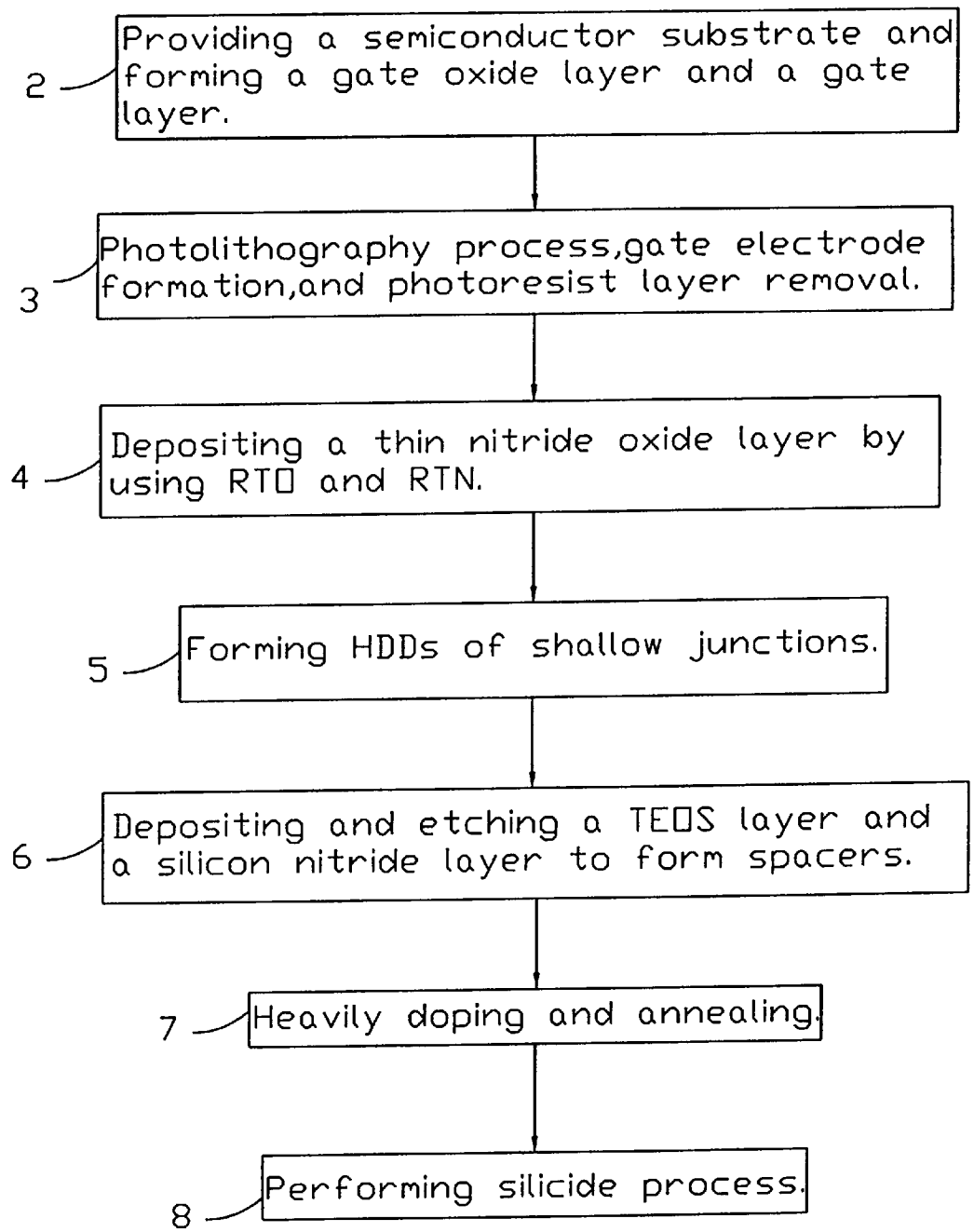
FIG. 1 is a flow diagram showing the key steps for producing PMOS devices for preventing boron segregation and out diffusion in according with a method disclosed herein.

Referring to FIG. 1 and in accordance with a method of preventing boron segregation and out diffusion that has been provided by the present specification a flowchart shows the key steps of a preferred embodiment of the present invention is present. First of all, stage 2 provides a semiconductor substrate and forms a gate oxide layer as well as a gate layer on top of the semiconductor substrate. Next, in stage 3, a photoresist layer is formed on a top surface of the gate layer, moreover, pattern transfers onto the photoresist layer after being through an exposure and a development. Furthermore, the gate layer and the gate oxide layer are then etched using the photoresist layer as a mask, and then the photoresist layer is removed afterward.

In succession, stage 4 utilizes rapid thermal oxidation (RTO) and rapid thermal nitridation (RTN) to grow a thin nitride oxide (NO,$N_2O$) layer. Hereafter, in stage 5, high doped drain regions of boron ion shallow junctions are formed by carrying out ion implantation. Stage 6 uses low pressure chemical vapor deposition (LPCVD) to deposit a TEOS layer and a silicon nitride layer, and forming spacers by etching the silicon nitride layer and the TEOS layer. Next, in stage 7, the heavy doping of boron ions has proceeded, as well as an annealing process. The final stage, stage 8, would be a procedure of forming metal silicides.

Referring to FIGS. 2A–2I, the process flow of a preferred embodiment according to the procedure mentioned in FIG. 1 that is depicted in cross-sectional views. These drawings merely show several key steps in sequential processes.

First of all, a semiconductor substrate 10, which is a silicon substrate and having N-type conductivity is delivered into an oxidation furnace tube. The silicon oxide on a surface of the substrate is then transformed to a layer of silicon dioxide having a thickness between about 100 angstroms and about 250 angstroms by using dry oxidation method. This silicon dioxide layer will be used as a gate oxide layer 11 for semiconductor devices. Sequentially, a polysilicon layer 12 having a thickness in between about 2000 angstroms and about 3000 angstroms is deposited on top of silicon dioxide by using chemical vapor deposition. Wherein, the related temperature is controlled roughly in between 600° C. and 650° C., and the related pressure is about 0.3 to 0.6 torr. The polysilicon layer 12 is then doped with highly dense phosphorus or arsenic by using thermal diffusion or ion implantation in order to reduce the resistivity of the gate hence, decreasing the "RC time delay" of a gate conductivity layer.

Figure 2A:
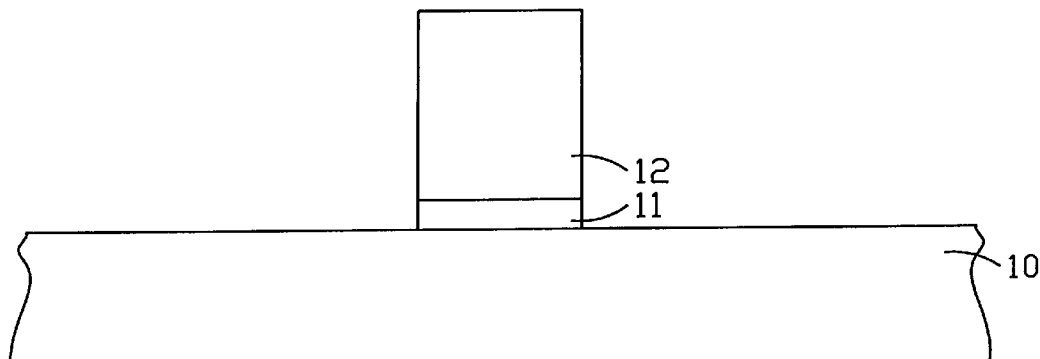
FIGS. 2A to 2I are schematic representations of structures at various stages during the formation of PMOS devices in accordance with the method of this disclosure.

Next, a photoresist layer is deposited over the polysilicon layer. The photoresist layer is used to perform regional exposure in making a perfect transference of pattern form a mask onto the photoresist layer. Then, a developing procedure for the photoresist layer is carried out to define a size of the gate. The photoresist layer is used as a mask for the etching of the polysilicon layer by using self-aligned reactive ion etching to form a gate electrode 12 structure, as well as removing the unwanted gate oxide layer. Last of all, the photoresist layer is removed by using either dry or wet etching method. The overall structure at current stage is shown in FIG. 2A.

Figure 2B:
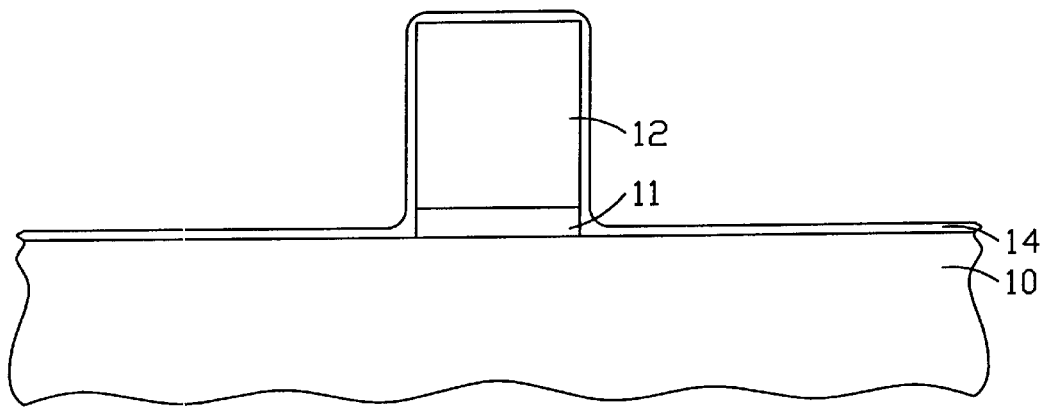

In FIG. 2B, a thin nitride oxide (NO,N$_2$O) layer 14 is formed on top of semiconductor substrate 10 and gate electrode 12 by using rapid thermal oxidation (RTO) and rapid thermal nitridation (RTN), wherein the thickness of nitride oxide (NO,N$_2$O) layer 14 is in between about 20 angstroms and about 30 angstroms. This particular layer is formed for the purpose of enhancing boron segregation resistivity. Moreover, during a follow-up annealing process, although a crystallized structure on the silicon wafer's surface can be recovered, thermal diffusion might occur inside the silicon wafer that is caused by the implanted boron ions. Hence, the boron ion density closes to the wafer's surface will be decreased and ends up with higher resistivity and lower driving current. By means of the formation of this thin nitride oxide (NO, N$_2$O) layer, reduction of boron ion density close to the surfaces of source/drain regions due to boron segregation to TEOS liner oxide layer and out diffusion can be effectively prevented during the annealing process. Therefore, the boron ion density close to the wafer's surface can be maintained, resulting in low resistivity source/drain regions and high driving current, furthermore, semiconductor device performance is improved.

Figure 2C:
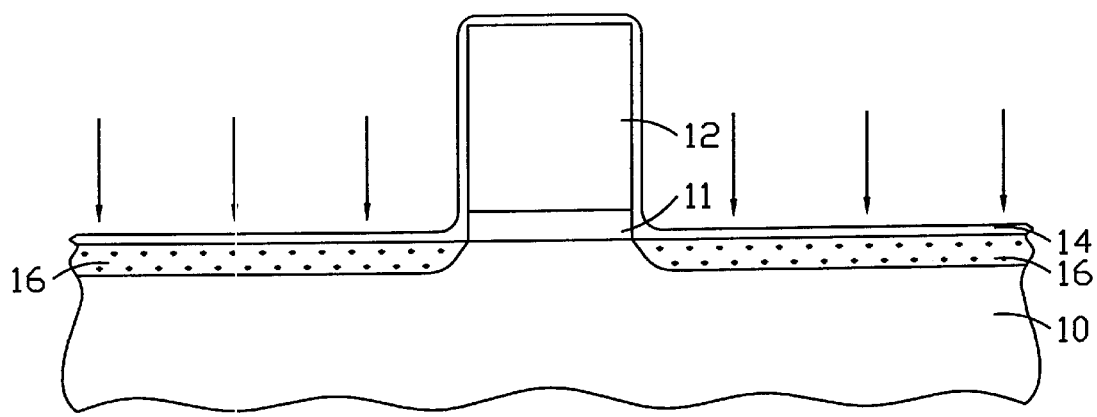

Subsequently, referring to FIG. 2C, the gate electrode 12 functions as a mask and boron is used as an ion source to implant boron ions (boron or boron fluoride) into the entire wafer. The ion implant energy been used is roughly in between 0.5 and 8 keV, and the doping density is about $10_{15}$ ions per centimeter square ($10^{15}$ ions/cm$^2$). The above procedure, is mainly used to form high doped drain regions (HDDs) 16 that substantially prevents the occurrence of short channel effect. Moreover, due to the usage of low energy, the implant depth by ion implantation inside the semiconductor substrate is shallower, hence, shallow junction as been named. One thing needs to be pointed out, that is, the procedure of ion implantation of shallow junction's HDDs can be carried out before the procedure of thin nitride oxide layer deposition. The order of those two procedures will not affect the present invention.

Figure 2D:
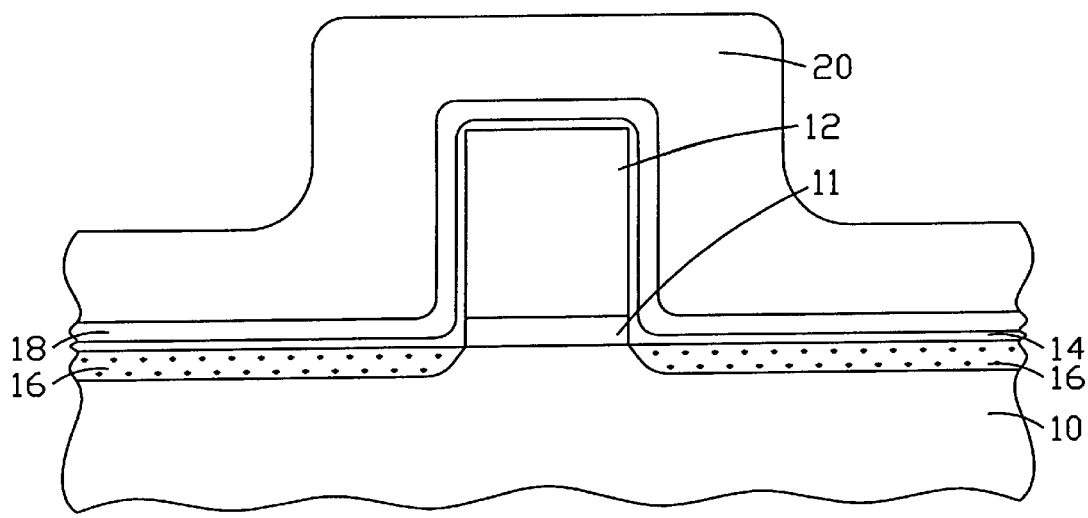
Figure 2E:
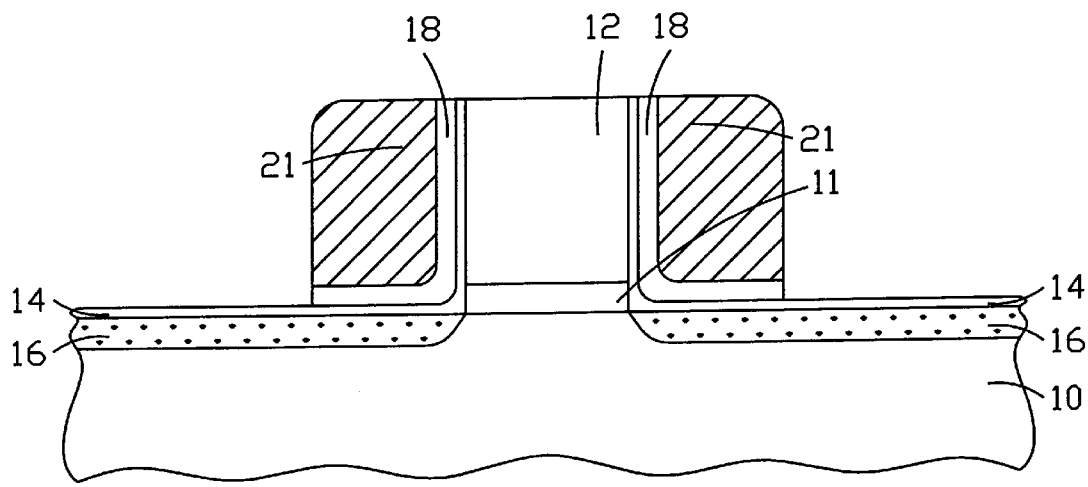

FIG. 2D shows firstly a TEOS layer 18 being deposited by using LPCVD onto the wafer to a thickness between about 200 angstroms and 500 angstroms. Then a silicon nitride layer 20 is deposited onto the wafer to a thickness in between about 1000 angstroms and 2000 angstroms by using LPCVD. Thereafter, in FIG. 2E, the silicon nitride layer 20 and the TEOS layer 18 are been etched by applying a non-isotropic etching method to form a spacer 21 on a sidewall of gate electrode 12.

Figure 2F:
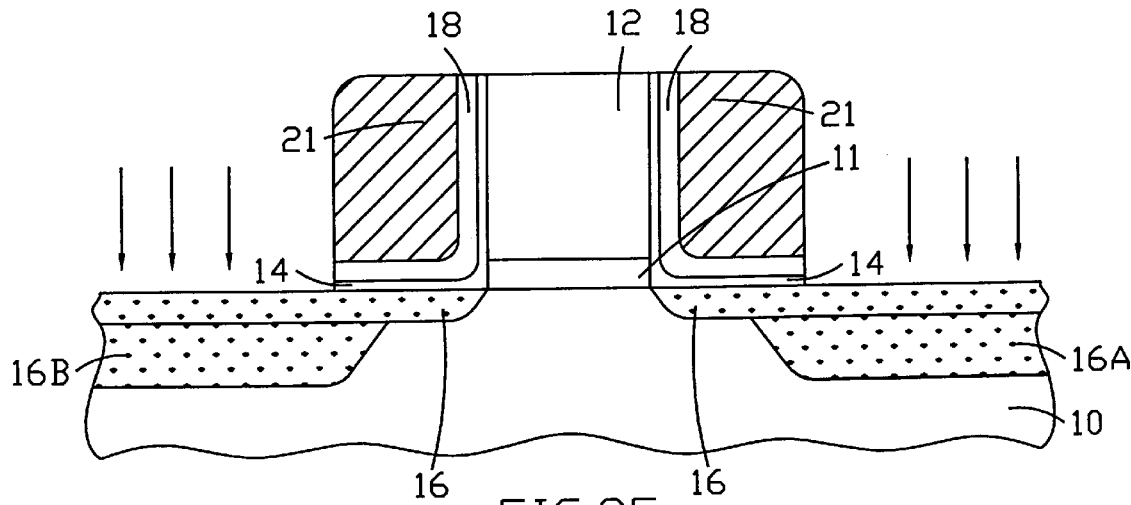

Referring to FIG. 2F, heavily doping of a source region 16A and a drain region 16B is performed by using boron (or boron fluoride) as the ion source to carry out a high density and deeper depth ion implantation against the wafer. Next, the resulting wafer is sent into a thermal diffusion furnace to a high temperature ranging from about 900° C. to about 1000° C. to perform boron atom diffusion. At the same time, the destroyed portion of boron atoms at the wafer surface due to ion implantation is annealed.

Subsequently, referring to the process shown from FIG. 2G to FIG. 2I, metal silicide process as it is been called, wherein the key features of this process are low resistivity, anti-electron migration, high melting point, etc. Metal silicide process is mainly applied on the formation of the polycide structure, which is very effective in forming low resistivity ohmic contacts in between polysilicon and metal conductors, in reducing RC delay time, and increasing device activation speed. Titanium, molybdenum, tantalum, tungsten, cobalt, etc. are the most common used elements for forming metal silicide. Subsequently, cobalt will be used as an example in depicting the process and the requirement of metal silicide.

Figure 2G:
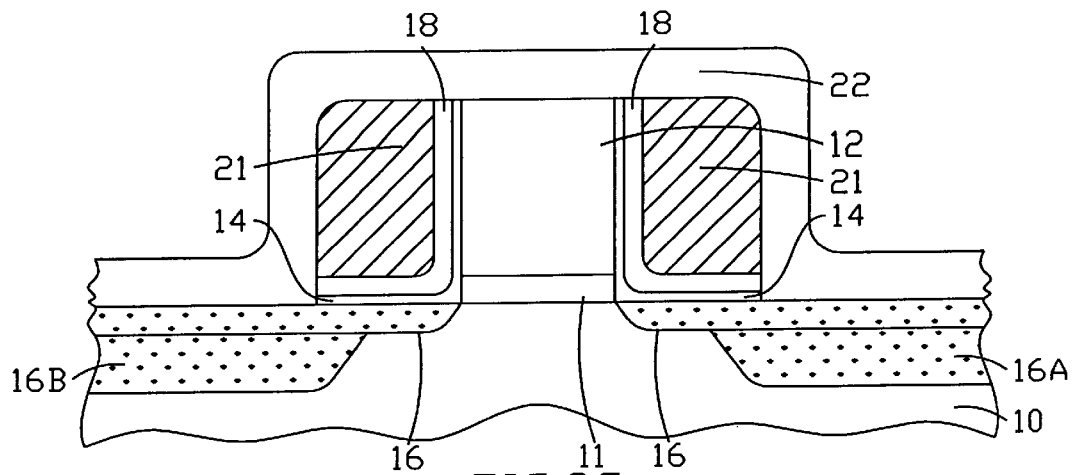
Figure 2H:
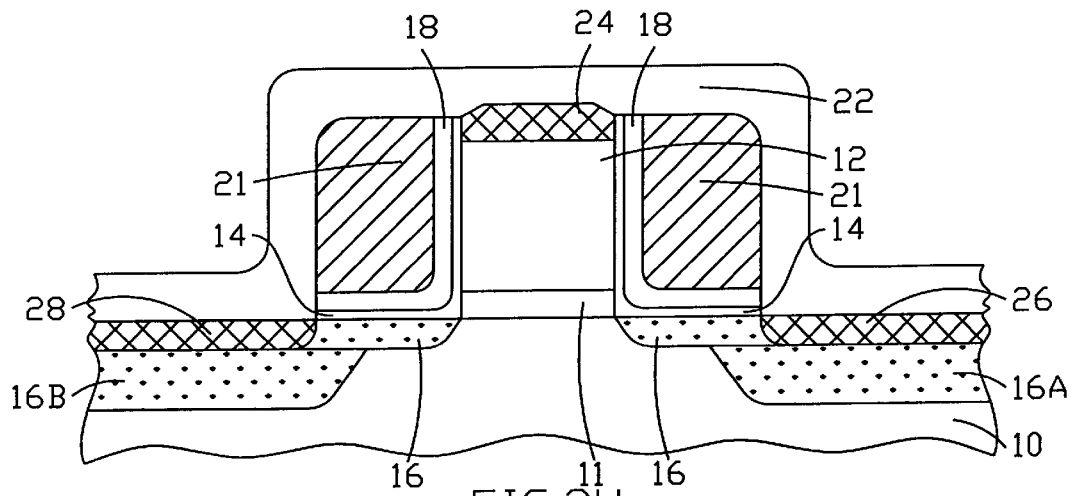
Figure 2I:
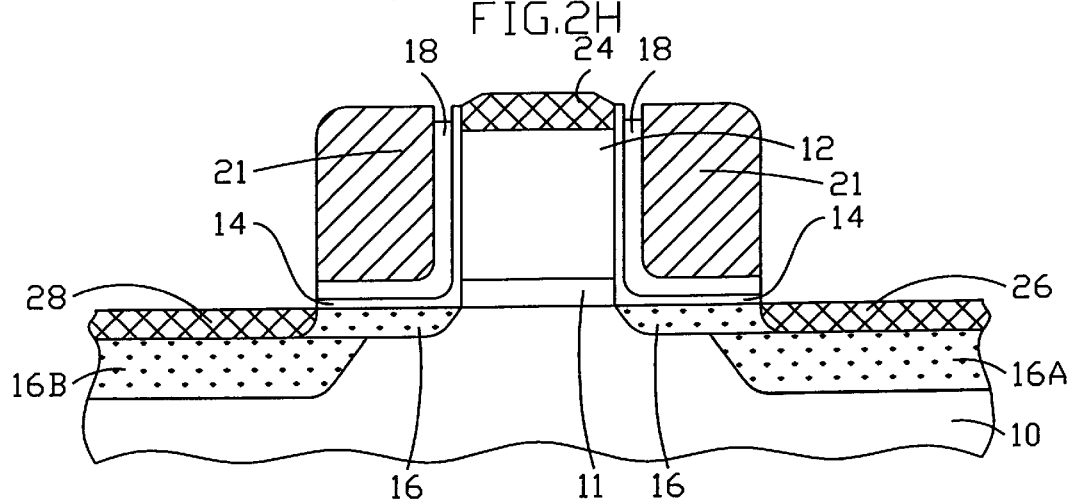

FIG. 2G shows a cobalt metal layer 22 been deposited onto the entire wafer surface to a thickness ranging from about 200 angstroms to 1000 angstroms by magnetron DC sputtering. Next, a high temperature between about 600° C. and about 800° C. is applied, and in the meanwhile, a portion of the deposited cobalt film has reacted with gate electrode's polysilicon and silicon of source/drain regions to form gate cobalt silicide 24, source region cobalt silicide 26, and drain region cobalt silicide 28, as is shown in FIG. 2H. In conclusion, unreacted cobalt and cobalt reaction product other than cobalt silicide are then removed by wet etching leaving the final structure shown in FIG. 2I.

Although specific embodiments have been illustrated and described, it will be obvious to those skilled in the art that various modifications may be made without departing from what is intended to be limited solely by the appended claims.

What is claimed is:

1. A method for preventing boron segregation and out diffusion for producing PMOS devices, said method comprising:

providing a semiconductor substrate having a first conductivity type;

forming a gate oxide layer on said semiconductor substrate;

forming a gate layer on said gate oxide layer;

firstly implanting said semiconductor substrate using said gate layer as a mask to form at least two high doped drain regions (HDDs) having a second conductivity type opposite to said first conductivity type;

forming a first dielectric layer on top of the exposed surface of said gate layer and on said semiconductor substrate, said first dielectric layer for preventing boron segregation and out diffusion, wherein material of said first dielectric layer is a compound of nitrogen and oxygen;

forming a second dielectric layer on said first dielectric layer;

forming a third dielectric layer on said second dielectric layer;

forming a dielectric spacer on sidewall of said gate layer and said gate oxide layer, thereby anisotropically etching portions of said third and said second dielectric layer;

secondly implanting said semiconductor substrate to form source/drain regions having the second conductivity type opposite to the first conductivity type by using said gate region and said spacer region as a mask;

annealing the resulting structure; and forming silicide on said source/drain regions and said gate region.

2. The method according to claim 1, wherein said semiconductor substrate comprises a n-type semiconductor substrate.

3. The method according to claim 1, wherein said gate layer comprises polysilicon.

4. The method according to claim 1, wherein said first dielectric layer comprises nitric oxide (NO).

5. The method according to claim 4, wherein said first dielectric layer is formed by has a thickness ranging from about 20 angstroms to about 30 angstroms.

6. The method according to claim 1, wherein said first dielectric layer comprises nitrous oxide ($N_2O$).

7. The method according to claim 6, wherein said first dielectric layer is formed by has a thickness ranging from about 20 angstroms to about 30 angstroms.

8. The method according to claim 1, wherein the dope of said firstly implantation comprises boron.

9. The method according to claim 1, wherein the dope of said firstly implantation comprises boron fluoride.

10. The method according to claim 1, wherein the energy of said firstly implantation is in between about 0.5 and 8 keV.

11. The method according to claim 1, wherein said second dielectric layer comprises TEOS.

12. The method according to claim 1, wherein said third dielectric layer comprises silicon nitride.

13. A method for preventing boron segregation and out diffusion for producing PMOS devices, said method comprising:

providing a semiconductor substrate having a first conductivity type;

forming a gate oxide layer on said semiconductor substrate;

forming a gate layer on said gate oxide layer;

forming a first dielectric layer on top of the exposed surface of said gate layer and on said semiconductor substrate, said first dielectric layer for preventing boron segregation and out diffusion, wherein material of said first dielectric layer is a compound of nitrogen and oxygen;

firstly implanting said semiconductor substrate using said gate layer as a mask to form at least two high doped drain regions (HDDs) having a second conductivity type opposite to said first conductivity type;

forming a second dielectric layer on said first dielectric layer;

forming a third dielectric layer on said second dielectric layer;

forming a dielectric spacer on sidewall of said gate layer and said gate oxide layer, thereby anisotropically etching portions of said third and said second dielectric layer;

secondly implanting said semiconductor substrate to form source/drain regions having the second conductivity type opposite to the first conductivity type by using said gate region and said spacer region as a mask;

annealing the resulting structure; and forming silicide on said source/drain regions and said gate region.

14. The method according to claim 13, wherein said semiconductor substrate comprises a n-type semiconductor substrate.

15. The method according to claim 13, wherein said gate layer comprises polysilicon.

16. The method according to claim 13, wherein said first dielectric layer comprises nitric oxide (NO).

17. The method according to claim 16, wherein said first dielectric layer is formed by has a thickness ranging from about 20 angstroms to about 30 angstroms.

18. The method according to claim 13, wherein said first dielectric layer comprises nitrous oxide ($N_2O$).

19. The method according to claim 18, wherein said first dielectric layer is formed by has a thickness ranging from about 20 angstroms to about 30 angstroms.

20. The method according to claim 13, wherein the dope of said firstly implantation comprises boron.

21. The method according to claim 13, wherein the dope of said firstly implantation comprises boron fluoride.

22. The method according to claim 13, wherein the energy of said firstly implantation is in between about 0.5 and 8 keV.

23. The method according to claim 13, wherein said second dielectric layer comprises TEOS.

24. The method according to claim 13, wherein said third dielectric layer comprises silicon nitride.

* * * * *